United States Patent
Whitney et al.

(10) Patent No.: US 7,564,337 B2
(45) Date of Patent: Jul. 21, 2009

(54) THERMALLY DECOUPLING FUSE HOLDER AND ASSEMBLY

(75) Inventors: Stephen J. Whitney, Lake Zurich, IL (US); Gordon T. Dietsch, Park Ridge, IL (US); Vincent Minh-Tu Tran, Arlington, TX (US)

(73) Assignee: Littelfuse, Inc., Des Plaines, IL (US)

( * ) Notice: Subject to any disclaimer, the term of this patent is extended or adjusted under 35 U.S.C. 154(b) by 186 days.

(21) Appl. No.: 11/072,553

(22) Filed: Mar. 3, 2005

(65) Prior Publication Data

US 2006/0197647 A1  Sep. 7, 2006

(51) Int. Cl.
*H01H 85/143* (2006.01)
*H01H 85/48* (2006.01)

(52) U.S. Cl. .................. 337/268; 337/187; 337/297; 439/250; 439/830; 439/890

(58) Field of Classification Search ............... 337/297, 337/187, 251, 268, 269; 439/250, 830, 890, 439/849, 850
See application file for complete search history.

(56) References Cited

U.S. PATENT DOCUMENTS

| | | | | |
|---|---|---|---|---|
| 2,229,989 | A * | 1/1941 | Roby | 439/830 |
| 3,871,738 | A * | 3/1975 | Dechelette | 439/830 |
| 4,052,688 | A * | 10/1977 | DeNigris et al. | 337/213 |
| 4,071,290 | A * | 1/1978 | DeNigris et al. | 439/830 |
| 4,176,906 | A * | 12/1979 | Urani | 439/830 |
| 4,556,274 | A * | 12/1985 | Olivera | 439/620.34 |
| 4,606,590 | A * | 8/1986 | Kauffmann et al. | 439/218 |
| 5,082,452 | A * | 1/1992 | Takano | 439/206 |
| 5,113,168 | A | 5/1992 | Lindquist | |
| 5,116,246 | A | 5/1992 | Perry et al. | |
| D326,845 | S | 6/1992 | Katz et al. | |
| 5,118,314 | A | 6/1992 | Mangone et al. | |
| 5,125,855 | A | 6/1992 | Brooks | |
| 5,145,414 | A | 9/1992 | Oikawa | |
| 5,150,094 | A | 9/1992 | Babini | |
| 5,167,541 | A | 12/1992 | Alves et al. | |
| 5,214,565 | A | 5/1993 | Flores | |
| D336,073 | S | 6/1993 | Happ | |
| D336,463 | S | 6/1993 | Nimpoeno et al. | |

(Continued)

OTHER PUBLICATIONS

Electronic Fuses, Fuseholders & Accessories, from Copper Industries/Bussman Division Catalog, Sep. 1997 (3 pgs.).

(Continued)

*Primary Examiner*—Anatoly Vortman

(57) ABSTRACT

In one aspect of the present invention, subminiature fuses are soldered to a PCB via clips attached to the fuse end caps. The clips are physically attached to the PCB pads, enabling the fuse to be replaced if needed and providing thermal decoupling between the fuse and the heating sinking solder/PCB pads. The fuse and clips can also be picked and placed in one operation. In another aspect, improved fuse clips are provided that include tabs that separate the housing portions of the clips from the heating sinking solder/PCB pads. Such improved clips further enhance thermal decoupling. In a further aspect, an improved fuse is provided, in which the thermal decoupling tabs just described are provided directly with the fuse. In yet a further aspect, a thermally insultive fuse body is provided to further decouple the fuse element from its surroundings.

13 Claims, 7 Drawing Sheets

U.S. PATENT DOCUMENTS

| | | | |
|---|---|---|---|
| 5,221,217 A | 6/1993 | Oikawa | |
| 5,222,131 A | 6/1993 | Heidorn et al. | |
| 5,249,985 A | 10/1993 | Obenauer | |
| 5,258,238 A | 11/1993 | Shimada | |
| 5,269,706 A | 12/1993 | Spanio | |
| 5,295,850 A | 3/1994 | Jeffcoat et al. | |
| 5,318,462 A | 6/1994 | Oakley | |
| 5,324,214 A | 6/1994 | De Castro | |
| 5,338,228 A * | 8/1994 | Wright et al. | 439/620.26 |
| 5,353,199 A * | 10/1994 | Ohashi | 361/809 |
| 5,365,395 A | 11/1994 | Callaway | |
| 5,374,205 A * | 12/1994 | Ohashi | 439/831 |
| 5,391,098 A * | 2/1995 | Ohashi | 439/830 |
| D364,848 S | 12/1995 | Miyanishi | |
| 5,476,396 A | 12/1995 | De Castro | |
| 5,519,586 A | 5/1996 | Byrd | |
| 5,532,668 A | 7/1996 | Fennell | |
| 5,559,489 A | 9/1996 | Weiden | |
| 5,561,409 A | 10/1996 | Rapp et al. | |
| 5,569,880 A * | 10/1996 | Galvagni et al. | 174/527 |
| 5,576,682 A | 11/1996 | Fisher et al. | |
| 5,616,054 A | 4/1997 | Quinlan | |
| D381,010 S | 7/1997 | Ansley | |
| 5,655,292 A | 8/1997 | Fisher et al. | |
| 5,659,282 A | 8/1997 | Nemoto | |
| 5,659,283 A | 8/1997 | Arratia | |
| 5,670,927 A | 9/1997 | Fennell | |
| D390,831 S | 2/1998 | Liang | |
| D394,843 S | 6/1998 | Ohta et al. | |
| 5,772,011 A | 6/1998 | Dumont | |
| 5,772,473 A | 6/1998 | Cheng et al. | |
| 5,797,298 A | 8/1998 | Grevel | |
| 5,816,858 A | 10/1998 | Kazarian et al. | |
| 5,833,497 A | 11/1998 | Byfield, Jr. | |
| 5,841,337 A | 11/1998 | Douglass | |
| D403,307 S | 12/1998 | Arzoumanian | |
| D406,111 S | 2/1999 | Awbrey | |
| D406,569 S | 3/1999 | Awbrey et al. | |
| 5,879,203 A * | 3/1999 | Egle et al. | 439/830 |
| 5,880,664 A | 3/1999 | Hollmann et al. | |
| 5,888,098 A | 3/1999 | Cheng et al. | |
| D407,693 S | 4/1999 | Rowton et al. | |
| D408,368 S | 4/1999 | Awbrey et al. | |
| 5,906,514 A | 5/1999 | Nelson, Jr. | |
| 5,941,735 A | 8/1999 | Bernardini | |
| RE36,317 E | 9/1999 | Arratia | |
| 5,982,266 A | 11/1999 | Sanford et al. | |
| 5,982,267 A | 11/1999 | Locht | |
| 5,984,730 A | 11/1999 | Lu | |
| 5,993,260 A | 11/1999 | Lindquist | |
| 6,004,159 A | 12/1999 | Liang | |
| 6,030,257 A | 2/2000 | Furuya | |
| 6,059,609 A | 5/2000 | Nieto | |
| 6,064,292 A | 5/2000 | Pongracz | |
| D427,976 S | 7/2000 | Douglass et al. | |
| D429,223 S | 8/2000 | Douglass et al. | |
| 6,142,314 A | 11/2000 | Cotterill | |
| 6,157,287 A | 12/2000 | Douglass et al. | |
| 6,186,633 B1 | 2/2001 | Zen et al. | |
| 6,215,173 B1 | 4/2001 | Echigoya | |
| 6,225,652 B1 * | 5/2001 | Devanney | 257/209 |
| 6,272,000 B1 * | 8/2001 | Spaunhorst et al. | 361/104 |
| 6,326,378 B1 | 12/2001 | Friebe et al. | |
| 6,406,331 B1 | 6/2002 | Brown | |
| D460,742 S | 7/2002 | Iby et al. | |
| D460,949 S | 7/2002 | Iby et al. | |
| D461,781 S | 8/2002 | Fukumori et al. | |
| D462,061 S | 8/2002 | Fukumori et al. | |
| 6,431,880 B1 | 8/2002 | Davis et al. | |
| 6,437,986 B1 | 8/2002 | Koshiba | |
| D462,331 S | 9/2002 | Fukumori et al. | |
| 6,443,771 B2 | 9/2002 | Kondo et al. | |
| 6,457,995 B1 | 10/2002 | Brooks | |
| 6,504,468 B2 | 1/2003 | Lee et al. | |
| 6,549,137 B1 | 4/2003 | Bruchmann | |
| 6,560,123 B1 | 5/2003 | de Varennes et al. | |
| D478,555 S | 8/2003 | Tomasino | |
| 6,666,722 B2 | 12/2003 | Fukumori et al. | |
| 6,666,723 B2 * | 12/2003 | Fukumori et al. | 439/620.26 |
| 6,692,315 B1 * | 2/2004 | Soumillon et al. | 439/830 |
| 6,700,081 B1 | 3/2004 | Houck, III | |
| 6,724,291 B1 | 4/2004 | Byaliy et al. | |
| 6,726,506 B2 | 4/2004 | Fukumori et al. | |
| D490,381 S | 5/2004 | Dejan | |
| 6,759,939 B2 | 7/2004 | Sudan et al. | |
| 6,774,759 B2 | 8/2004 | Kolody et al. | |
| 6,794,979 B2 | 9/2004 | Sudan et al. | |
| 6,796,841 B1 | 9/2004 | Cheng et al. | |
| 6,837,755 B1 * | 1/2005 | Kitajima et al. | 439/830 |
| 6,851,982 B2 | 2/2005 | Ku | |
| 6,855,008 B1 | 2/2005 | Freitag et al. | |
| 6,878,004 B2 * | 4/2005 | Oh | 439/250 |
| 6,881,909 B2 | 4/2005 | Hauck, III | |
| 2003/0049955 A1 | 3/2003 | Schilling | |

OTHER PUBLICATIONS

Surface Mount Fuses, SMF Omni-Blok Fuse Block order form from Littlefuse catalog (1 pg.).
Fuse Blocks and Clips for 3AG Screw Terminal order form from Littlefuse catalog (1 pg.).
Fuse Blocks and Clips for Various Diameter Fuses order form from Littlefuse catalog (2 pgs.).

* cited by examiner

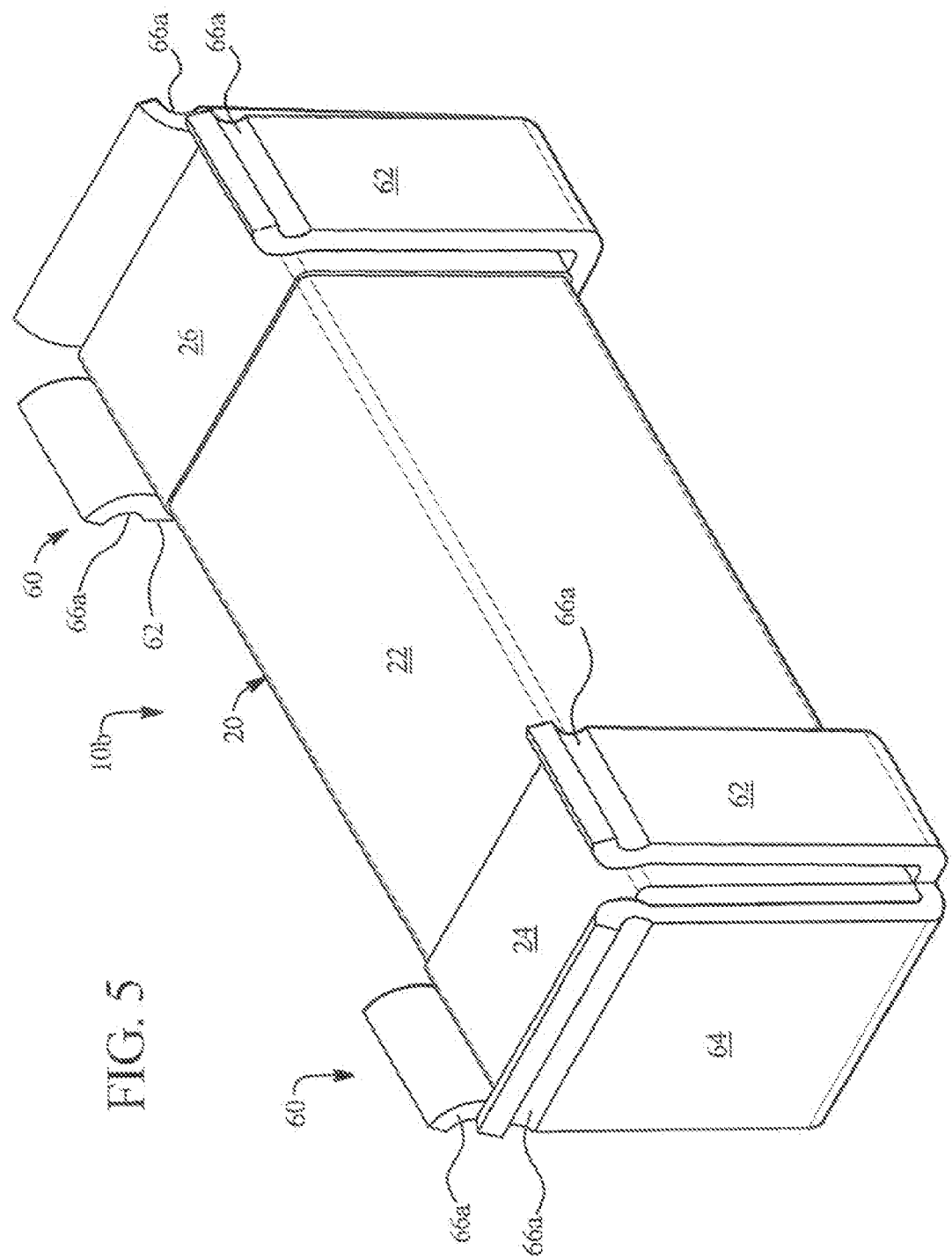

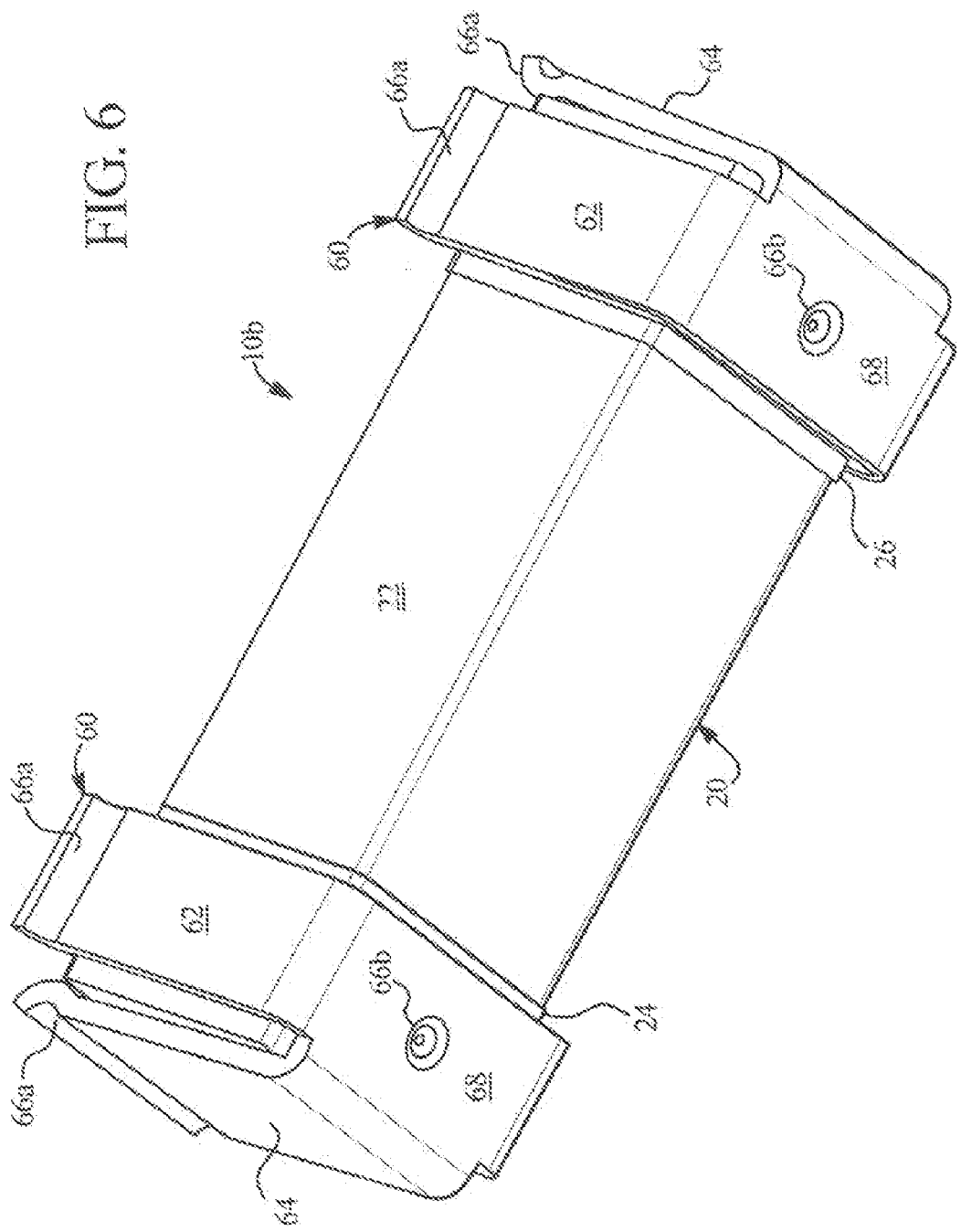

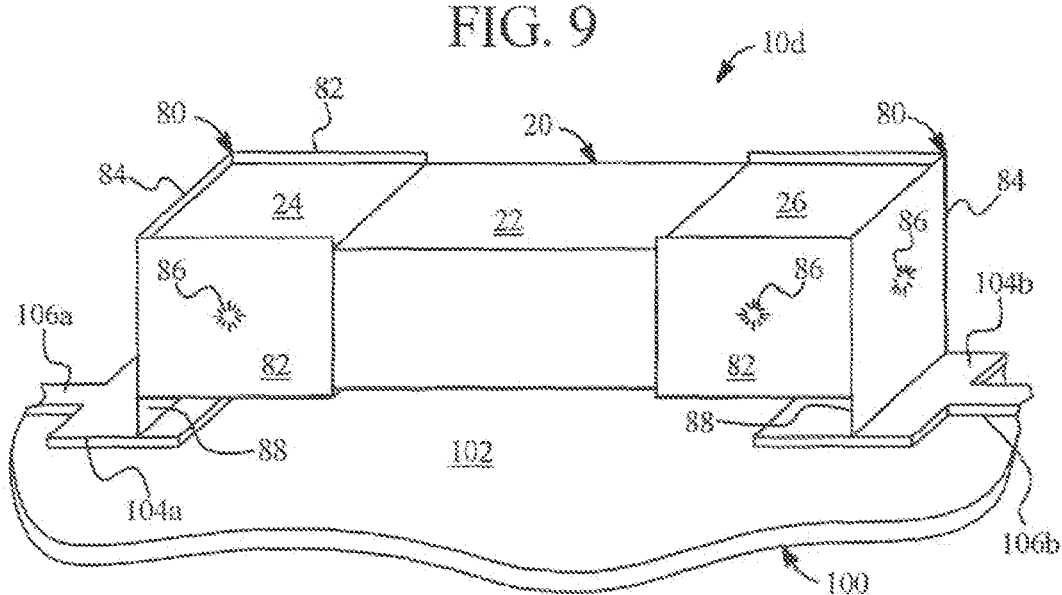
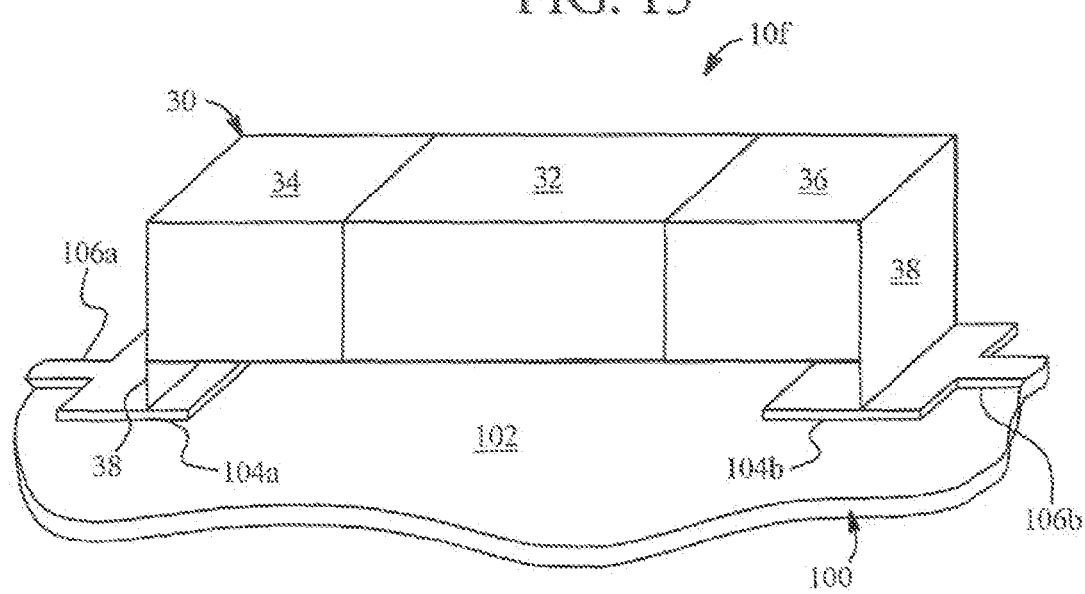

THERMALLY DECOUPLING FUSE HOLDER AND ASSEMBLY

BACKGROUND OF THE INVENTION

The present invention relates to circuit protection and more particularly to fuse protection. Miniature cartridge fuses commonly include a main insulating housing, conductive end caps secured to the housing and a fuse element or wire extending across the end caps. The cup-shaped or open end caps include a skirt portion that extends over the ends of the housing. The fuse element may be electrically and physically secured to the end caps via a body of solder in each of the end caps. The solder can also extend into small clearance spaces between the skirt of the end caps and the electrically insulative housing.

Miniature or subminiature cartridge fuses are typically soldered directly to a printed circuit board ("PCB") via a process called reflow soldering. The miniature fuse is typically picked and placed onto conductive pads of the PCB, which have been coated or printed with a solder paste. The PCB carrying the fuse is sent through an oven called a reflow oven. The reflow oven heats the PCB and fuse to a temperature that melts the solder paste beneath the miniature fuse. The solder paste melts or reflows at a temperature of, e.g., 180 to 186° C. as the PCB travels through the oven. Afterward, the PCB and associated components cool, allowing the solder paste to harden and fix the miniature fuse to the PCB.

Larger surface mounted or PCB fuses can be placed in clips that are soldered to the PCB. Prior art FIG. 1 shows one example of a pair of such clips 12, which are manufactured by the assignee of the present invention. The fuse can be, e.g., a ¼ inch (6.35 mm) fuse that is clipped into spring-like walls 14 and 16 of clips 12. Clips 12 are spaced apart on the PCB so that walls 14 and 16 extend around and connect electrically with the end caps of a replaceable fuse.

Clips 12 are soldered to the PCB via an alternative process called wave soldering. Here pins 18 extending downwardly from walls 14 and 16 are fitted into holes formed in the PCB. The PCB is sent through a machine called a wave soldering machine, which can have one or more waves of flowing solder. The solder from the waves wicks up through the holes in the PCB into which pins 18 are inserted as the PCB is conveyed over the one or more waves. After the PCB passes the solder bath, the solder cools and creates solder joints holding clips 12 to the PCB. The fuse may then be inserted into clips 12.

Prior art FIGS. 2 and 3 illustrate another surface mountable fuse holder, which is also manufactured by the assignee of the present invention. Here, a plastic housing 40 is provided in assembly with a fuse 42. Plastic housing 40 includes side walls 44 and end walls 46. Terminals 48 are attached to housing 40. Terminals 48 communicate electrically with the end caps of fuse 42 and are soldered to the PCB via the above-described reflow soldering process. The fuse end caps and clips have surface finishes which facilitate solder attachment of the clips to the circuit board pads, but will not reflow the fuse end caps to the clips during the soldering operation. Fuse 42 is replaceable as is the fuse used with clips 22 of FIG. 1.

Both reflow and wave soldering form solder joints between conductive pads provided on the PCB and the directly mounted fuses or the fuse clips. The solder and pads act as a heat sink, potentially preventing the fuse from reacting as quickly as desired to an overcurrent condition because heat generated by self-heating of the fuse element in response to the overcurrent condition is conducted away from the fuse element via the end caps to the circuit board pads and traces, either via the clips, or directly in the case where the fuse is attached directly to the PCB. This conductance of heat away from the fuse element can prevent the element from reaching its melting temperature, thus interrupting the overload condition as intended.

Further, as discussed above, some surface-mounted fuses are mounted directly to the PCB. If such fuses open, the PCB must be reworked, which entails diagnosis, removal of the PCB from the application, possible shipping or transport of the PCB and potentially harmful hand-soldering to remove and replace the fuse.

Accordingly, a need exists for an improved surface mount fuse assembly.

SUMMARY OF THE INVENTION

The present invention provides an improved circuit protection device and assembly. The present invention includes several inventive aspects. In one aspect of the present invention, an improved apparatus and method of mounting a miniature or subminiature PCB fuse is provided. As discussed above, miniature PCB fuses are mounted directly to the PCB. This causes two problems, potential PCB rework and thermal coupling with the solder and PCB pads.

The present invention in one embodiment provides small fuse clips that are packaged with the miniature or subminiature fuse to form a fuse assembly. The fuse assembly is picked and placed onto the PCB and thereafter reflow or wave soldered to the PCB. The clips, not the fuse, are soldered to the board. The clips can have leaf-spring type walls, or the walls may have indents or detents to hold the fuse end caps and fuse in place frictionally but replaceably. The clips provide two benefits: (i) they enable an opened miniature fuse to be removed and replaced, preventing costly and potentially damaging rework and (ii) they thermally decouple the fuse from the solder and pads of the PCB. The fuse of the assembly also provides a benefit by spacing apart separate fuse clips so that the clips automatically align with the PCB pads when placed onto the PCB.

In a second aspect of the present invention, the above-described assembly is further improved through the addition of tabs or standoffs to the clips. The tabs or standoffs space the fuse end caps even further away from the solder joints and PCB mounting pads, providing enhanced thermal decoupling. The tabs can be formed integrally with the clips or be attached to the clips. The tabs can extend outwardly sideways from the clips so that the clips sit on the PCB, or extend downwardly from the clips so that the clips and fuse are propped up from the PCB. Accordingly, the resulting solder joints may extend laterally or vertically away from the clips. The clips in an embodiment are finished with a material, such as gold flash that will not reflow in the soldering operation.

In any embodiment, the clips may hold any suitable PCB fuse and are not limited to holding subminiature cartridge fuses. For example, the fuses may be of any of the following types: midget, 2AG, 3AG, 3AB, 5×20 mm, Nano$^2$®, Pico® SMF or chip fuses.

The clips may be reflow or wave soldered to the PCB. For example, the thermally decoupling extension tabs described above may terminate in pads that are reflow soldered to pads on the PCB or pins that extend through the PCB for attachment via wave soldering.

In a third aspect of the present invention, the above-described thermal decoupling tabs or standoffs extend from the end caps of the fuse, not from the separate clips. Here, the tabs or standoffs space the fuse end caps away from the solder joints and PCB mounting pads, providing enhanced thermal decoupling. The tabs can be formed integrally with the end caps or be attached to the end caps. The tabs can extend outwardly sideways from the end caps so that the end caps sit on the PCB, or extend downwardly from the end caps so that the end caps and fuse are propped up from the PCB. To those ends, the resulting solder joints may reside laterally or vertically away from the clips.

It is therefore an advantage of the present invention to provide an improved PCB fuse assembly.

It is another advantage of the present invention to provide an improved PCB fuse assembly clip.

It is a further advantage of the present invention to provide an improved PCB fuse.

Moreover, it is an advantage of the present invention to improve thermal characteristics and response time for surface mounted fuses.

It is yet another advantage of the present invention to provide an improved method and apparatus for assembling a fuse to a PCB.

Additional features and advantages of the present invention are described in, and will be apparent from, the following Detailed Description of the Invention and the figures.

BRIEF DESCRIPTION OF THE FIGURES

FIGS. 5 and 6 are perspective views of one embodiment of a pair of improved fuse clips and associated fuse assembly, which is similar to the embodiment described in connection with FIG. 4.

FIG. 9 is a perspective view of a further embodiment of a pair of improved fuse clips and associated fuse assembly of the present invention.

FIGS. 10, 11 and 22 are perspective, front and side views, respectively, of another embodiment of a pair of improved fuse clips and associated fuse assembly, which is similar to the embodiments of FIGS. 7 to 9.

FIG. 13 is a perspective view of one thermally decoupling fuse of the present invention.

DETAILED DESCRIPTION OF THE INVENTION

The present invention provides an improved electrical device. More specifically, the present invention provides an improved PCB fuse assembly, fuse clip and fuse. In one aspect, subminiature fuses are soldered to a PCB via clips attached to the fuse end caps. The clips are physically attached to the PCB pads, enabling the fuse to be replaced if needed and providing thermal decoupling between the fuse and the heating sinking solder/PCB pads. The fuse and clips can also be picked and placed in one operation. In another aspect, improved fuse clips are provided that include tabs that separate the housing portions of the clips from the heating sinking solder/PCB pads. Such improved clips further enhance thermal decoupling. In a further aspect, an improved fuse is provided, in which the thermal decoupling tabs just described are provided directly with the fuse.

Figure 1:
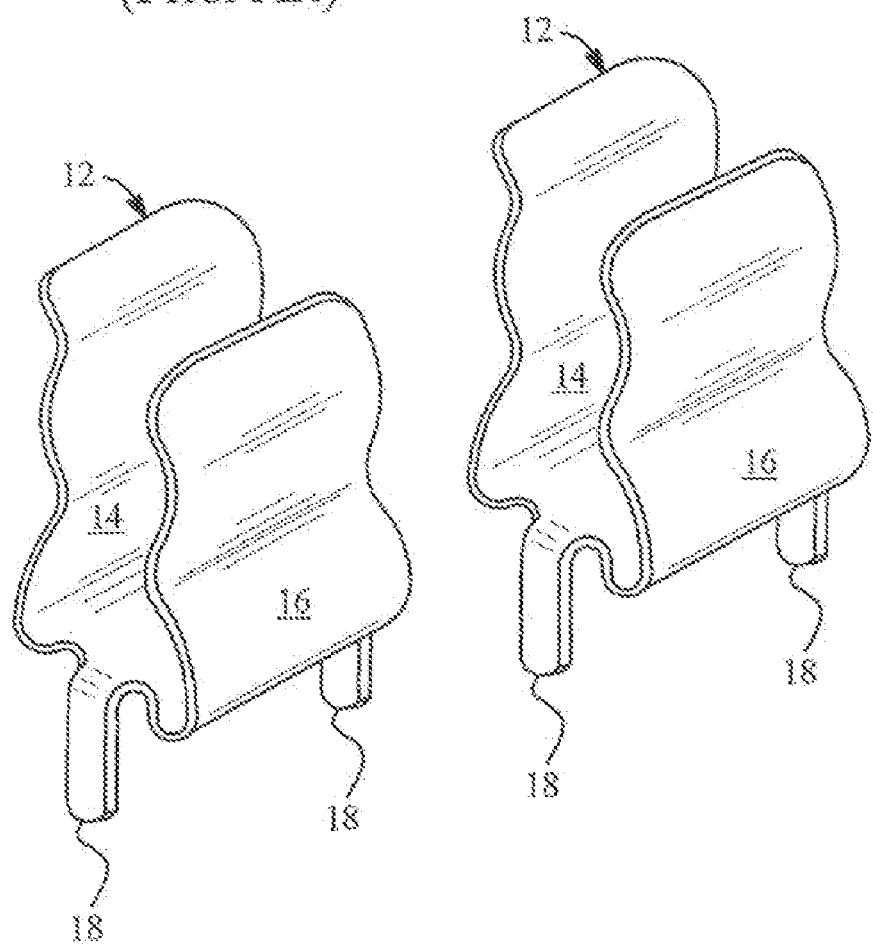
FIG. 1 is a perspective view of prior art printed circuit board ("PCB") mountable fuse holding clips.
Figure 3:
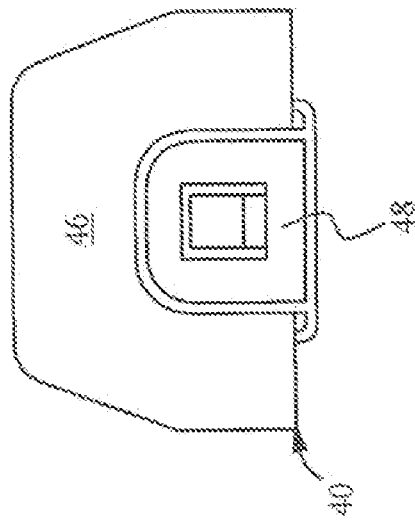
FIG. 3 is a side view of the prior art fuse holder with installed fuse of FIG. 2.
Figure 2:
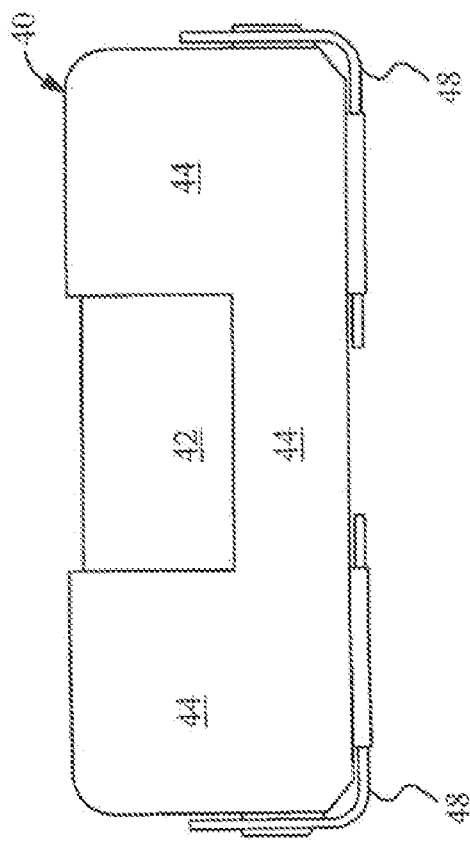
FIG. 2 is a front view of another prior art PCB mountable fuse holder with installed fuse.
Figure 4:
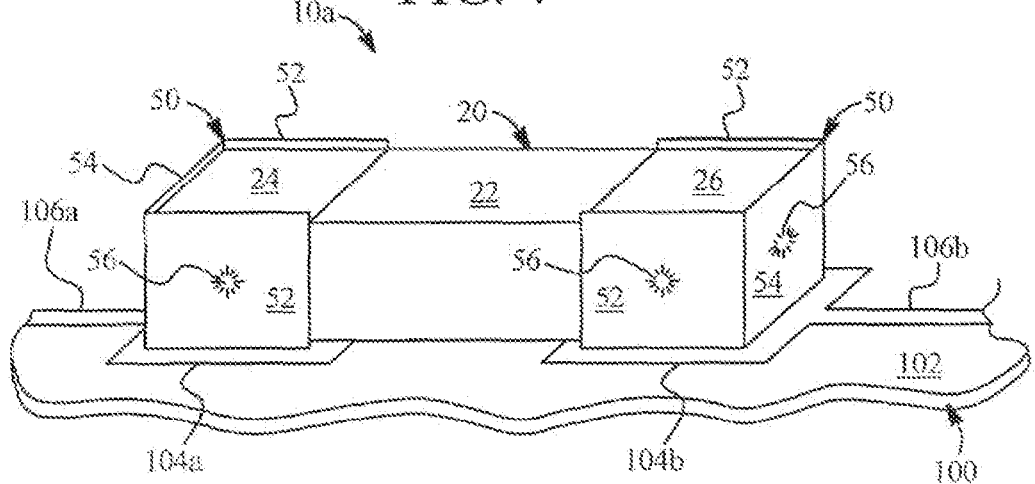
FIG. 4 is a perspective view of one embodiment of an assembled and thermally decoupled fuse and associated fuse clips of the present invention.

Referring now to the drawings and in particular to FIGS. 4 to 6, various embodiments for thermally decoupled fuse clips and associated fuse assemblies are illustrated. Each of the assemblies 10a and 10b includes a fuse 20, a pair of fuse clips 50, 60 and a printed circuit board ("PCB") 100. In one embodiment, fuse 20 is a so-called "cartridge fuse," which is a small fuse that is typically surface mounted to a PCB. The smallness of the fuse and the method of its attachment to the PCB create a number of manufacturing and operational issues that have led to the apparatus and method of the present invention.

Fuses 20 include an electrically insulative body 22. A pair of end caps 24 and 26 is fixed to or attached to electrically insulative body 22. Electrically insulative body 22 includes a top, a bottom, a front and a back in the illustrated embodiment. In other embodiments, body 22 is round or has another suitable cross-sectional shape. Body 22 can initially be open on its ends, which are capped with caps 24 and 26. Body 22 may be made of any suitable insulating material, such as a ceramic material, glass material or a relatively high temperature electrically insulative polymer. A glass or polymer body is less thermally conductive than ceramic and has the advantage of yet further thermal decoupling of the fuse element from its surroundings. For example, a boro-silicate or soda-lime material may be used for the body 22.

End caps 24 and 26 may be made of any suitable conductive material, such as copper, tin, nickel, gold, silver, brass and any combination thereof. End caps 24 and 26 may include any suitable one or more coatings, such as a nickel, gold, tin, silver, copper, intermediate or finish coating. The intermediate or finish coatings may be selectively applied, so that only intended portions of the clips are coated. Further, alloys of the above metals may also be used for the base and plating materials of end caps 24 and 26. Still further, the end caps may not have any plated coatings.

In an embodiment, caps 24 and 26 are open five-sided structures, including an end plate and a four-walled skirt extending from the end plate. In an alternative embodiment, end caps 24 and 26 are at least substantially cylindrical, and the end plates are at least substantially circular. Other suitable shapes for the end caps, housings and fuses are also within the scope of the present invention.

In one embodiment, end caps 24 and 26 are pre-plated or pre-prepared internally with solder. In one implementation, the inner surfaces of the end plates are plated or pre-prepared with an area of solder. The solder areas may additionally or alternatively extend to the inner surfaces of the skirts of end caps 24 and 26.

Caps 24 and 26 in one embodiment fit over electrically insulative body 22 so that a small amount of clearance exists between inner surfaces of the skirts of end caps 24 and 26 and the outer surfaces of electrically insulative housing 22. Alternatively, the skirts of end caps 24 and 26 are sized such that their inner surfaces create an interference fit with the outer surfaces of housing 22. Here, the inner surfaces of the skirts of end caps 24 and 26 may be plated or pre-prepared with solder to ensure that solder resides between the caps 24 and 26 and body 22 upon assembly.

A fuse element or wire of fuse 20 (not seen, located inside body 22) is attached to the above-described solder areas and thus to end caps 24 and 26 in one of a variety of ways. In one way, after end caps 24 and 26 are placed over housing 22, the fuse element is fitted through small holes in the relative centers of the end plates of caps 24 and 26. In another embodiment, the fuse element 32 is fixed to one of the end caps 24 and 26 and is fused or connected to the other cap 24 or 26 during the soldering process. In still a further embodiment, the fuse element extends diagonally within housing 22 and is bent at both ends around the outside of electrically insulative housing 22 before the end caps 24 and 26 are placed on the housing. The press-fit or soldering process then holds the fuse element in place. The fuse element may be for example a fast opening element.

The fuse elements can have a variety of forms and shapes. The fuse element can be a spirally wound conductive wire on an electrically insulative or conductive substrate. The fuse element is alternatively a braided or a single strand of wire. The fuse element further alternatively has a serpentine shape. Any of the above fuse elements may include a core conductive material, such as copper, which is plated for example with tin, gold or silver. The fuse elements can also be coiled or spiral-wound or have any other suitable configuration. In an embodiment, the fuse elements are sized and dimensioned to open or melt upon a certain current or energy threshold.

As described above, end caps 24 and 26 may make an interference fit with body 22. Alternatively or additionally, body 22 may include indents or recesses (not illustrated), which accept tabs or detents (not illustrated) that extend inwardly from the skirts of caps 24 and 26. The adhesion that the solder areas create between the housing 22 and end caps 24 and 26 can also provide cap retention.

It should be appreciated that each and every teaching described for fuse 20 is equally applicable for fuse 30 described below.

Clips 50 of assembly 10a of FIG. 4 each include a bottom wall (not seen), side walls 52 and a rear wall 54. Side walls 52 and rear wall 54 in the illustrated embodiment include or define indents or detents 56 (referred to collectively herein as indents). Indents 56 hold fuse 20 removeably in place. Specifically, indents 56 press fit onto end caps 24 and 26 of fuse 20 and make electrical contact with same. The bottom wall of clips 50 can also have an indent (see e.g., FIG. 6). Indents 56 serve further to thermally isolate or decouple fuse 20 from the surrounding heat sinking. That is, they reduce the amount of surface area contact between clips 50 and end caps 24 and 26 of fuse 20.

Assembly 10a in one embodiment is picked and placed onto PCB 100. One clip 50 is placed onto PCB conductive pad 104a, while another clip 50 is placed onto PCB conductive pad 104b. The length of fuse 20 spaces clips 50 apart a determined distance corresponding to the distance between pads 104a and 104b. Pads 104a and 104b connect respectively to traces 106a and 106b, which lead to desired electrical locations.

Clips 50 (like all other clips described herein) in an embodiment are made of brass, spring brass, copper, beryllium-copper, phosphor-bronze, steel, nickel or alloys thereof, possibly with an intermediate barrier layer of nickel, and a finish layer of tin, tin-lead, nickel, silver, gold, palladium, palladium alloys or rhodium. The intermediate and finish layers may be applied selectively so that only certain portions of the clips are coated. Pads 104a, 104b and traces 106a, 106b (for each embodiment described herein) are made of copper and are etched onto PCB 100 in one embodiment. PCB 100 (for each embodiment herein) can be rigid, e.g., be of an FR-4 material or other glass-epoxy composite, ceramic, polymer material, or be made of a flexible material, e.g., a polyimide, Kapton™ material, or other material.

Once clips 50 are soldered to pads 104a and 104b, fuse 20 may be removed if opened from clips 50. A replacement fuse 20 can then be placed into clips 50 without the extensive rework associated with directly mounted fuses. In the illustrated embodiment, clips 50 are reflow soldered to pads 104a and 104b. In an alternative embodiment, clips 50 include pins that extend through holes drilled in PCB 100. The pins are then wave soldered to PCB 100 and associated pads 104a and 104b. Clips 50 may directly contact pads 104a and 104b, wherein, e.g., solder flows around sides 52 and back 54 of clips 50 to seal the sides to pads 104a and 104b. Clips 50 may alternatively indirectly contact pads 104a and 104b, wherein, e.g., the solder provides an interface (intermetallic bonding) between clips 50 and pads 104a and 104b.

Clips 60 of assembly 10b of FIGS. 5 and 6 each include a bottom wall 68, side walls 62 and an end wall 64. Bottom walls 68 in the illustrated embodiment include or define indents or detents 66b. Indents 66b serve further to thermally isolate or decouple fuse 20 from the surrounding heat sinking. Here, indents 66b prop end caps 24 and 26 of fuse 20 up from the larger surface area of bottom walls 68.

Assembly 10b in one embodiment is picked and placed onto PCB 100. One clip 60 is placed onto a first PCB conductive pad, while the other clip 60 is placed onto another PCB conductive pad. The length of fuse 20 spaces clips 60 apart a determined distance corresponding to the distance between pads.

As illustrated, walls 62 and 64 extend individually from base 68. Walls 62 and 64 are leaf-spring like and enable fuse 22 to snap into and out of clips 60. Walls 62 and 64 each include bent portions 66a that snap over end caps 24 and 26 to hold fuse 20 within clips 60. In an embodiment, walls 62 and 64 do not contact or completely contact end caps 24 and 26, rather, bent portions 66a contact walls 62 and 64. Such configuration enhances the thermal decoupling characteristics of clips 60 for reasons discussed above, while still providing a firm fit. Bent portions 66a and indent 66b in essence provide a four point (or edge) contact with end caps 24 and 26.

Once clips 60 are soldered to the pads of PCB 100, fuse 20 may be removed if opened from clips 60. A replacement fuse 20 can then be placed into clips 60 without the extensive rework associated with directly mounted fuses. In the illustrated embodiment, clips 60 are reflow soldered to the pads of PCB 100. In an alternative embodiment, clips 60 include pins that extend through holes drilled in PCB 100. The pins are then wave soldered to PCB 100 and associated pads. Clips 60 may directly contact the pads, wherein, e.g., solder flows around sides 62 and back 64 of clips 60 to seal the sides to the pads. Clips 60 may alternatively indirectly contact the pads of PCB 100, wherein, e.g., the solder provides an interface (intermetallic bonding) between clips 60 and the pads.

Figure 7:
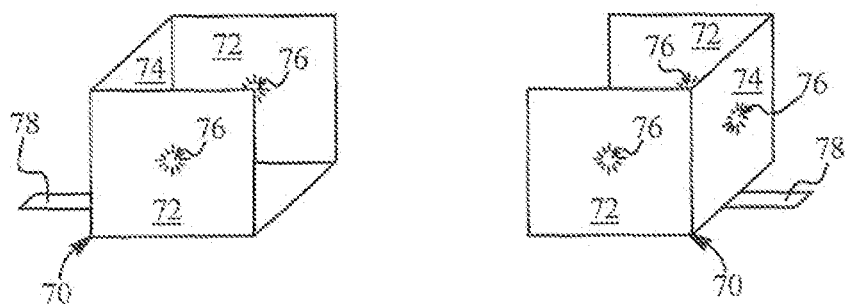
FIG. 7 is a perspective view of another embodiment of a pair of improved fuse clips of the present invention.
Figure 8:
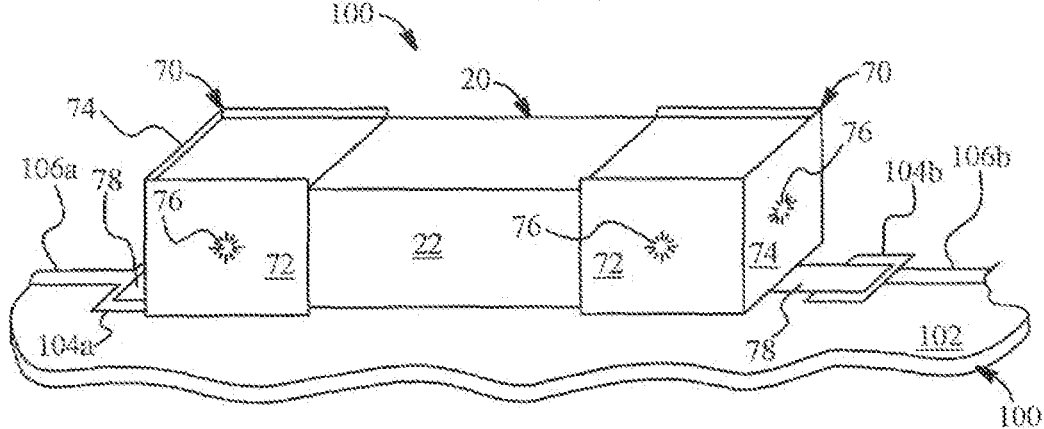
FIG. 8 is a perspective view of the fuse clips of FIG. 7 assembled with a fuse and PCB.

Clips 70 of FIG. 7 and assembly 10c of FIG. 8 each include a bottom wall, side walls 72 and a rear wall 74. Side walls 72 and rear wall 74 in the illustrated embodiment include or define indents or detents 76. Indents 76 hold fuse 20 removeably in place. Specifically, indents 76 press fit onto end caps 24 and 26 of fuse 20 and make electrical contact with same. The bottom wall of clips 70 can also have an indent (see e.g., FIG. 6). Indents 76 serve further to thermally isolate or decouple fuse 20 by creating point contact as described herein.

As seen in FIGS. 7 and 8, clips 70 each include tabs 78. Tabs 78 extend from a housing portion of clips 70, which is made up of the bottom wall and walls 72 and 74. Tabs 78 separate the housing portion of clips 70 and thus the fuse 20 residing within clips 70 horizontally from the heat sinking solder pads 104a and 104b and associated solder. Tabs 78 may be formed integrally with the housing portions of clips 70 or be attached, e.g., welded to the housing portions. Tabs 78 may be made of the same or different material as the material of the housing portions of clips 70. Tabs 78 may have any suitable shape as needed to maximize their thermal decoupling and rigidity.

Assembly 10c in one embodiment is picked and placed onto PCB 100. One tab 78 is placed onto PCB conductive pad 104a, while the other tab 78 is placed onto PCB conductive pad 104b. The length of fuse 20 and tabs 78 spaces the ends of tabs 78 apart a determined distance corresponding to the distance between pads 104a and 104b. Pads 104a and 104b connect respectively to traces 106a and 106b, which each lead to a desired electrical location.

Once tabs 78 of clips 70 are soldered to pads 104a and 104b, fuse 20 may be removed if opened from clips 70. A replacement fuse 20 can then be placed into clips 70 without the extensive rework associated with directly mounted fuses. In the illustrated embodiment, tabs 78 of clips 70 are reflow soldered to pads 104a and 104b. In an alternative embodiment, tabs 78 include pins that extend through holes drilled in PCB 100. The pins are then wave soldered to PCB 100 and associated pads 104a and 104b. Tabs 78 of clips 70 may directly contact pads 104a and 104b, wherein, e.g., solder flows around the sides of tabs 78. Tabs 78 may alternatively indirectly contact pads 104a and 104b, wherein, e.g., the solder provides an interface (intermetallic bonding) between tabs 78 and pads 104a and 104b.

Assembly 10d of FIG. 9 illustrates an alternative embodiment of assembly 10c of FIG. 8. Each of the features and embodiments described above for assembly 10c of FIG. 8 is applicable here, except as follows. Here, clips 80 each include a housing portion having bottom walls, side walls 82 and a rear wall 84. Tabs 88 extend downwardly from the housing portions of clips 80. Tabs 88 separate the housing portion of clips 80 and thus the fuse 20 residing within clips 70 vertically from the heat sinking solder pads 104a and 104b and associated solder. Tabs 88 may be formed integrally with the housing portions of clips 80 or be attached, e.g., welded to the housing portions. Tabs 88 may be made of the same or different material as the material of the housing portions of clips 80. Tabs 88 may have any suitable shape as needed to maximize their thermal decoupling and rigidity.

Figure 10:
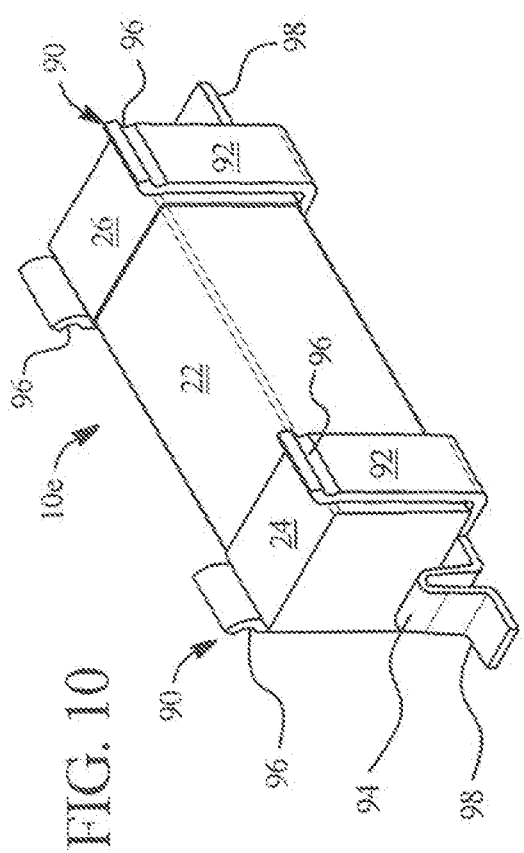
Figure 11:
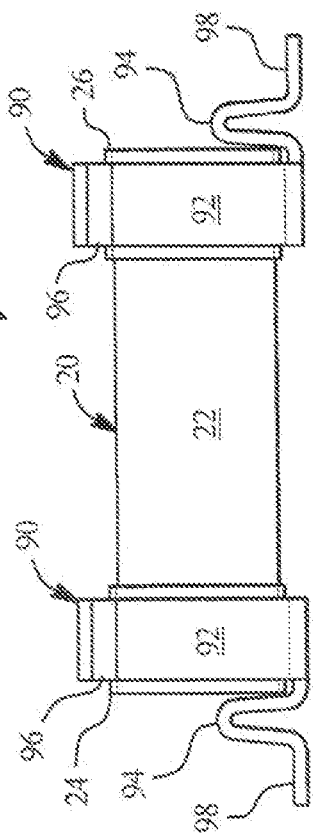
Figure 12:
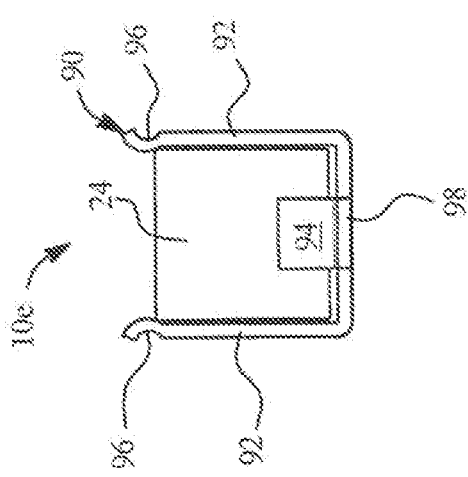

Assembly 10e of FIGS. 10 to 12 illustrates one preferred embodiment of the present invention. Assembly 10e employs clips 90. Clips 90 each include a housing portion having side walls 92 and a bent rear wall 94. The housing portion of clips 90 is similar to clips 60 of FIGS. 5 and 6 in that walls 92 and 94 extend individually from a base of clips 90. The base may have an indent that creates a point contact with the bottoms of end caps 24 and 26. Walls 92 and 94 are leaf-spring like and enable fuse 22 to snap into and out of clips 90. Walls 92 and 94 each include bent portions 96 that snap over end caps 24 and 26 to hold fuse 20 within clips 60. In an embodiment, walls 92 and 94 do not contact or substantially contact end caps 24 and 26, rather, bent portions 96 contact walls 62 and 64. Such configuration enhances the thermal decoupling characteristics of clips 90 for reasons discussed above, while still providing a firm fit. Bent portions 96, the lower edge of bent rear wall 94 (see FIG. 11) and the indent of the base in essence provide a four point or edge contact with end caps 24 and 26.

Like assemblies 10c and 10d, clips 90 include decoupling tabs 98. Tabs 98 extend from the bent rear walls 94 of housing portions of clips 90. Tabs 98 separate the housing portions of clips 90 and thus the fuse 20 residing within clips 90 horizontally from the heat sinking solder pads and associated solder on PCB 100. Tabs 98 as illustrated are formed integrally with the housing portions of clips 90. Alternatively, tabs 98 are attached, e.g., welded to the housing portions. Tabs 98 may be made of the same or different material as the material of the housing portions of clips 90. Tabs 98 may have any suitable shape as needed to maximize their thermal decoupling and rigidity.

Assembly 10e in one embodiment is picked and placed onto PCB 100. One clip 90 is placed onto a first PCB conductive pad, while the other clip 90 is placed onto another PCB conductive pad. The length of fuse 20 and tabs 98 space clips 90 and tabs 98 apart a determined distance corresponding to the distance between pads.

Once tabs 98 are soldered to the pads of PCB 100, fuse 20 may be removed if opened from clips 90. A replacement fuse 20 can then be placed into clips 90 without the extensive rework associated with directly mounted fuses. In the illustrated embodiment, tabs 98 are reflow soldered to the pads of PCB 100. In an alternative embodiment, tabs 98 include pins that extend through holes drilled in PCB 100. The pins are then wave soldered to PCB 100 and associated pads. Tabs 98 may directly contact the pads, wherein, e.g., solder flows around sides of tabs 98. Tabs 98 may alternatively indirectly contact the pads of PCB 100, wherein, e.g., the solder provides an interface (intermetallic bonding) between clips 90 and the pads.

Referring now to FIG. 13, assembly 10f illustrates fuse 30 of the present invention. Fuses 30 includes an electrically insulative body 32. A pair of end caps 34 and 36 is fixed to or attached to electrically insulative body 32 as described above for fuse 20. Electrically insulative body 32 includes a top, a bottom, a front and a back in the illustrated embodiment. In other embodiments, body 32 is round or has another suitable cross-sectional shape. Body 32 can initially be open on its ends, which are capped off with caps 24 and 26. As discussed above, each of the alternative embodiments and features discussed with fuse 20 is applicable to fuse 30.

End caps 34 and 36 of fuse 30 include tabs or tab portions 38. Tabs 38 extend downwardly from the housing portions of fuse 30 in the illustrated embodiment. Alternatively, tabs 38 extend horizontally from end caps 34 and 36. Tabs 38 separate the end caps 34 and 36 and thus the fuse 30 vertically (alternatively horizontally) from the heat sinking solder pads 104a and 104b and associated solder. Tabs 38 may be formed integrally with end caps 34 and 36 or be attached, e.g., welded to the end caps. Tabs 38 may be made of the same or different material as the material of end caps 34 and 36. Tabs 38 may have any suitable shape as needed to maximize their thermal decoupling and rigidity. A glass or polymer body is less thermally conductive than ceramic and has the advantage of yet further thermal decoupling the fuse element from its surroundings.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A printed circuit board ("PCB") fuse assembly comprising.
    a first housing portion configured to hold a first terminal of a fuse, the first housing portion including a bottom wall, side walls, and a rear wall;
    a first tab extending downwardly from the rear wall of the first housing portion, the first tab soldered to the PCB via a first solder joint andhaving a length such that the first housing portion is spaced apart from the PCB;

a second housing portion configured to hold a second terminal of the fuse, the second housing portion including a bottom wall, side walls, and a rear wall; and a second tab extending downwardly from the rear wall of the second housing portion, the second tab soldered to the PCB via a second joint and having a length such that the second housing portion is spaced apart from the PCB.

2. The PCB fuse assembly of claim 1, wherein the length of the first tab is substantially the same as the length of the second tab.

3. The PCB fuse assembly of claim 1, which includes a fuse held by the first and second housing portions.

4. The PCB fuse assembly of claim 1, wherein the fuse is of a type selected from the group consisting of: midget, 2AG, 3AG, 3AB, 5×20 mm, Nano²®, Pico® SMF and chip fuses.

5. The PCB fuse assembly of claim 1, wherein the first and second tabs are soldered to the PCB via a process selected from the group consisting of: wave soldering and reflow soldering.

6. The PCB fuse assembly of claim 1, wherein the first and second tabs are formed integrally with the first and second housing portions, respectively.

7. The PCB fuse assembly of claim 1, wherein the first and second tabs are connected to the first and second housing portions, respectively.

8. The PCB fuse assembly of claim 1, wherein the housing portions and the tabs are made of a material selected from the group consisting of a conductive material, ceramic, glass, polymer, brass, spring brass, copper, beryllium-copper, phosphor-bronze, steel, nickel, nickel alloy, tin, tin-lead, silver, gold, palladium, palladium alloy and rhodium.

9. The PCB fuse assembly of claim 1, wherein the PCB is made of a material selected from the group consisting of FR-4 material, ceramic, flexible material, cross-linked material, glass-epoxy composite, ceramic, and polymer material.

10. The PCB fuse assembly of claim 1, wherein the first and second housing portions are spaced apart on the .PCB a distance corresponding to at least one of a length of the fuse and the length of the tabs.

11. The PCB assembly of claim 1, wherein the first and second tabs are spaced apart on the PCB according to a distance that a plurality of conductive pads on the PCB are spaced apart.

12. The PCB fuse assembly of claim 1, wherein the rear walls corresponding to the first and second housing portions each include an indent extending inwardly from the rear walls.

13. The PCB fuse assembly of claim 1, wherein the rear walls and the side walls corresponding to the first and second housing portions each include an indent extending inwardly, and the bottom wails each include an indent extending upwardly.

\* \* \* \* \*